United States Patent [19]
Kim et al.

[11] Patent Number: 5,969,549
[45] Date of Patent: Oct. 19, 1999

[54] CURRENT DETECTION START-UP CIRCUIT FOR REFERENCE VOLTAGE CIRCUIT

[75] Inventors: Dae Jeong Kim, Seoul; Youn-Cherl Shin, Kyungki, both of Rep. of Korea

[73] Assignee: LG Semicon Co., Ltd., Choonqcheongbuk-Do, Rep. of Korea

[21] Appl. No.: 08/957,363

[22] Filed: Oct. 24, 1997

[30] Foreign Application Priority Data

Oct. 24, 1996 [KR] Rep. of Korea ............ 96-47882

[51] Int. Cl.$^6$ ............................................. H01L 7/00
[52] U.S. Cl. ..................................... 327/143; 327/543
[58] Field of Search ........................... 323/312, 313, 323/314, 315, 316; 327/142, 143, 198, 530, 534, 535, 537, 538, 543, 545, 546

[56] References Cited

U.S. PATENT DOCUMENTS

| | | | |
|---|---|---|---|
| 4,342,926 | 8/1982 | Whatley | 307/297 |
| 5,565,811 | 10/1996 | Park et al. | 327/143 |
| 5,686,825 | 11/1997 | Suh et al. | 323/316 |

*Primary Examiner*—Timothy P. Callahan
*Assistant Examiner*—Jeffrey Zweizig

[57] ABSTRACT

An improved current detection start-up circuit for a reference voltage circuit which restarts a reference voltage circuit when a reference voltage drops by a predetermined level, i.e., turns off, due to noise or a variation of a system voltage. The circuit includes: a current detection circuit for detecting the current being applied to a reference voltage circuit; and a start-up circuit for starting the reference voltage circuit when the current detected by the current detection circuit is below a predetermined level.

9 Claims, 2 Drawing Sheets

CURRENT DETECTION START-UP CIRCUIT FOR REFERENCE VOLTAGE CIRCUIT

FIELD OF THE INVENTION

The present invention relates to a current detection start-up circuit for a reference voltage circuit, e.g., for use in a DRAM, and particularly to an improved current detection start-up circuit for a reference voltage circuit which can restart a reference voltage circuit when noise or a variation of the system voltage has otherwise turned off the reference voltage circuit.

BACKGROUND OF THE INVENTION

FIG. 1 is a circuit diagram of a conventional reference voltage circuit.

As shown therein, a start-up circuit 10 for a conventional reference voltage circuit 20 includes: an inverter 11 for inverting a reset signal /RESET; an NMOS transistor 12 the gate of which receives the output from the inverter 11; and an NMOS transistor 13 the drain of which is connected to the source of the NMOS transistor 12, the gate of which is connected to the drain, and the source of which is connected to a ground voltage Vss.

The reference voltage circuit 20 includes: a PMOS transistor 21 the gate and drain of which are commonly connected at the node N20 with the drain of the NMOS transistor 12, the source of the transistor 21 being connected to the voltage Vcc; a PMOS transistor 22, the source of which is connected to Vcc, the gate of which is connected to the gate of the PMOS transistor 21, forming a current mirror with the PMOS transistor 21; an NMOS transistor 23 the drain of which is connected at the node N20 to the drain of the PMOS transistor 21; a resistor 24 connected between the NMOS transistor 23 and the ground voltage in series; and an NMOS transistor 25 forming a current mirror with the NMOS transistor 23, the gate and the drain of the NMOS transistor 25 being connected to the drain of the PMOS transistor 22 and the gate of the NMOS transistor 23.

The operation of the start-up circuit 10 of the conventional reference voltage circuit 20 will now be explained with reference to FIG. 1.

First, when a source voltage is initially applied to the circuit, the reset signal /RESET maintains a low level for an initial interval as the system voltage rises from Vss toward Vcc, and the low level value of /RESET is converted into a high level signal by the inverter 11. Therefore, the NMOS transistor 12 is turned on, though the electric potential of the node N20 begins to decrease until the PMOS transistor 21 and 22 gets turned on. After /RESET goes to "high" level, NMOS transistor 12 is turned off and the reference voltage circuits 20 stars to be stabilized in its quiescent state. This is how the reference voltage maintains a predetermined value, i.e., reaches its quiescent state.

The system voltage varies. Sometimes the variation is a large drop in magnitude that is usually of relatively short duration, i.e., the system voltage can briefly drop far below Vcc. Such a drop in the system voltage can cause transistor 22 to turn off, which causes Vref to discharge from its quiescent value down to Vss.

Once Vref drops significantly below its quiescent value, very little current flows through from the voltage Vcc to ground through transistor 22 and transistor 25. Hence, Vref cannot return to its quiescent value unless /RESET undergoes a negative pulse. This can only occur, however, if the system power is removed and reapplied so as to trigger a power-on initialization. Thus, the conventional start-up circuit 10 is unable to restart the reference voltage circuit 20 if there is a dip in the system voltage sufficient to discharge Vref to Vss.

SUMMARY OF THE INVENTION

Accordingly, it is an object of the present invention to provide a current detection start-up circuit for a reference voltage circuit which overcomes the aforementioned problems encountered in the conventional art.

It is another object of the present invention to provide an improved current detection start-up circuit for a reference voltage circuit which restarts a reference voltage circuit when a reference voltage drops by a predetermined level, i.e., turns off, due to noise or a variation of a voltage.

To achieve the above objects, there is provided a current detection start-up circuit for a reference voltage circuit which includes a current detection circuit for detecting the current being applied to a reference voltage circuit; and a start-up circuit for restarting the reference voltage circuit when the current detected by the current detection circuit is below a predetermined level.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
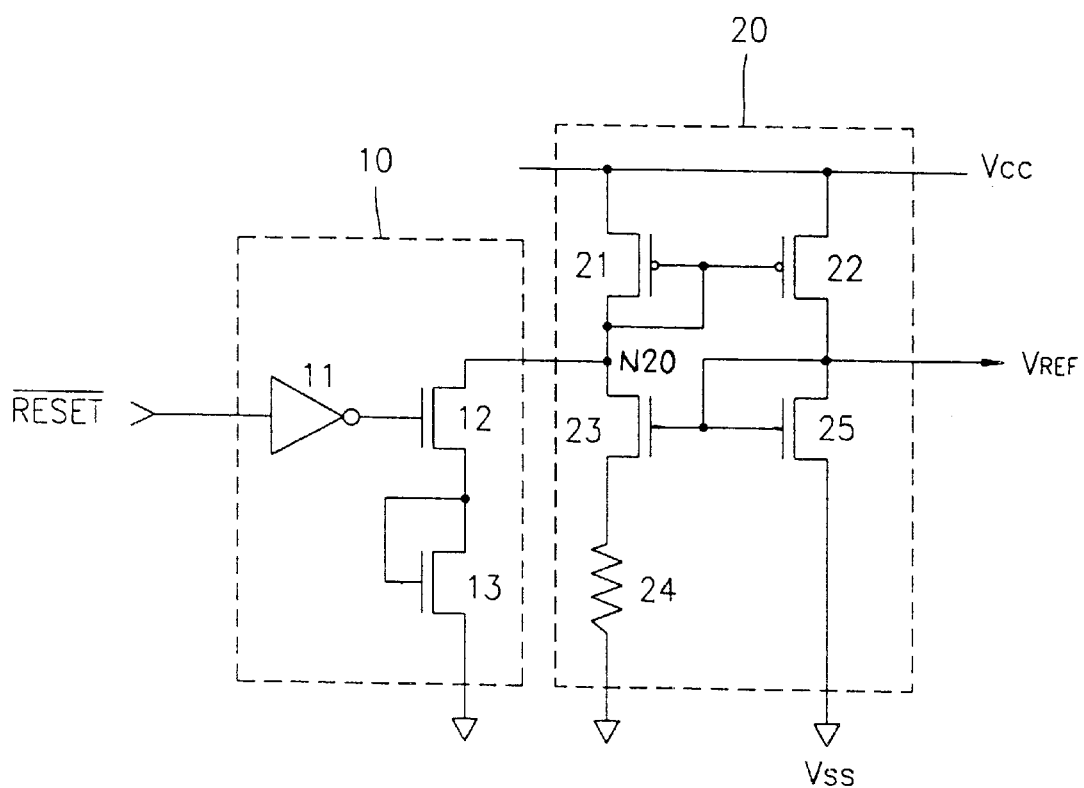
FIG. 1 is a circuit diagram of a conventional reference voltage circuit.
Figure 2:
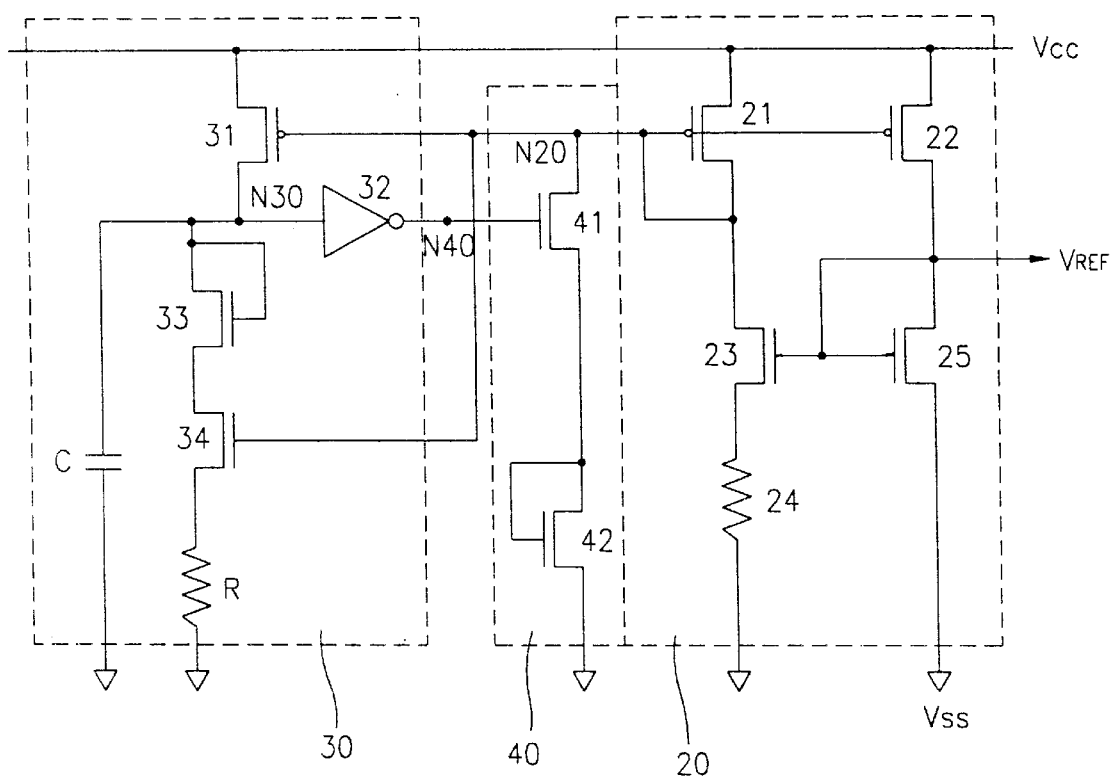
FIG. 2 is a circuit diagram of a a current detection start-up circuit for a reference voltage circuit according to the present invention.

FIG. 2 is a circuit diagram of a current detection start-up circuit for a reference voltage circuit according to the present invention.

As shown therein, the current detection start-up circuit of a reference voltage circuit according to the present invention includes a reference voltage circuit 20, a current detection circuit 30 and a start-up circuit 40.

The current detection circuit 30 includes: a PMOS transistor 31 forming a current mirror with a PMOS transistor 21 of the reference voltage circuit 20, the sources of which are connected to an electric power voltage Vcc, the gates of the transistors 31 and 21 being connected to a node N20; an NMOS transistor 33, the gate and drain of which are connected to the node N30; an optional MOS capacitor C connected between the node N30 and ground; an NMOS transistor 34 the gate of which is connected to the sense voltage at the node N20, the drain of which is connected to the source of the transistor 33; an optional resistor R connected between ground and the source of the transistor 34; and an inverter 32 the input of which is connected to the node N30.

The start-up circuit 40 includes: an NMOS transistor 41 the drain of which is connected to the node N20, the gate of which receives the output of the inverter 32 at the node N40; and an NMOS transistor 42 the drain and gate of which are connected to the source of the NMOS transistor 41 in series, i.e., the gate and drain of the NMOS transistor 42 are commonly connected to each other, the source of the transistor 42 being connected to the ground voltage.

Since the reference voltage circuit 20 has the same elements as the conventional reference voltage circuit 20, the same reference numerals have been used.

The operation of the current detection start-up circuit according to the present invention will now be explained with reference to FIG. 2.

First, when the reference voltage circuit 20 is normally operated, a constant direct current (DC) is applied at the node N20 to the gate of the PMOS transistor 21, and the same DC is applied to the gate of the PMOS transistor 31 of the current detection circuit 30. This forms a current mirror from the PMOS transistors 21 and 31.

After a power-on initialization is completed, the sense voltage Vsense on node N20 is Vsense<Vcc–$|V_{TP}|$, $|V_{TP}|$ is the absolute value of the thereshold voltage of PMOS transistor. This keeps current flowing through transistors 23 and 25, and preserves Vref in its quiescent state.

The current mirroring transistor 31 has the same current going through it as transistor 21. Hence, a large current flows through node N30 to charge the capacitor C because transistor 34 is nearly off. The gate of the transistor 34 is connected to Vsense, which is low enough to turn off the transistor 34.

The large current through N30 raises the voltage on node N30, to almost Vcc. This makes the node N40 be the inverse of Vcc, i.e., Vss. The low value on the node N40 turns off transistor 41, so that little to no current flows through transistor 42 to ground.

When there is a dip in the system voltage so that it drops from Vcc to Vss for a short time, the reference voltage generator 20 turns off, as described above. The sense voltage Vsense rises to almost Vcc, such that Vcc–Vsense <$|Vt_p|$ (transistors 21 and 22), and they stop conducting. The reference voltage is Vref>Vt(transistor 25), so Vref discharges from its quiescent level down to Vss. This turns off transistors 23 and 25.

At the same time that transistors 23 and 25 turn off, transistor 31 is off but transistor 34 is on because Vsense is almost at the level of Vcc. When transistor 34 is on, the mode N30 will be discharged through it and transistor 33. If the optional capacitor C is not present, then only the parasitic capacitances associated with node N30 will discharge in this manner. As the voltage of the node N30 drops near Vt(transistor 33), it drops below the logic threshold of the inverter 32. This causes the inverter 32 to raise the voltage on node N40 to Vcc.

Once node N40 has returned to Vcc, the transistor 41 turns on and then a current path to ground is formed. This current path is through transistor 21 (via the diode-like connection of its drain to its source), transistor 41 and transistor 42. Also, current will flow through transistor 21, transistor 23 and resistor 24. Similarly, current will also flow through transistor 22 and transistor 25.

These three current paths cause Vsense to begin to drop below Vcc. This causes the transistor 34 to conduct much less current, so that the voltage on the node N30 returns to Vcc, which makes the voltage on the node N40 goes to Vss.

With its gate voltage at Vss, the transistor 41 turns off. The start-up circuit 40 is off and the reference voltage Vref will now oscillate toward its quiescent Value.

When the reference voltage circuit 20 is operating normally, i.e., when the start-up circuit 30 is off or in standby mode, there is no standby current dissipated by the start-up circuit 30. Such a current would have to flow through transistors 31, 33 and 34. The transistors 31 and 34, however, operate like complimentary switches. When transistor 31 is on, then transistor 34 is off, and vice-versa. Hence, no path forms by which a standby current could flow to ground from Vcc. This is a great advantage when the present invention is used in a device for which minimal power consumption is an important criterion.

Unlike the conventional art, the present invention can detect when Vref drops to Vss, e.g., due to a dip in the system voltage. The present invention can then automatically perform the equivalent of triggering a /RESET pulse as in the conventional art, without having to turn off the system voltage.

As described above, the current detection start-up circuit 30 according to the present invention detects current being applied to the reference voltage circuit 20 and starts the reference voltage circuit 20 when the reference voltage circuit 20 has been turned off due to noise or the like, for thus generating a normal reference voltage.

Althought the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A current detection start-up circuit for a reference voltage circuit, comprising:
   a current detection circuit for detecting a current being applied to said reference voltage circuit, said current detection circuit including
      a first transistor, together with a part of said reference voltage circuit, for forming a current mirror, a source of said first transistor being a system voltage,
      a second transistor of an opposite conductivity type then said first transistor, said first and second transistors being connected at gates thereof to a same voltage, respectively, and
      an inverter for inverting an output signal related to said first and second transistors; and
   a start-up circuit for restarting said reference voltage circuit when said current detected by said current detection circuit is below a predetermined level.

2. The current detection start-up circuit of claim 1, wherein said first transistor is a PMOS transistor and said start-up circuit includes:
   a first NMOS transistor a drain of which is connected to the gate of said PMOS transistor of said current detection circuit, a gate of said first NMOS transistor receiving an output from said inverter of said current detection circuit.

3. The current detection start-up circuit of claim 2, wherein said current detection circuit further includes:
   a second NMOS transistor connected with said PMOS transistor in series, a gate and a drain of said second NMOS transistor being connected to a drain of said PMOS transistor.

4. The current detection start-up circuit of claim 1, wherein said first transistor is a PMOS transistor and said second transistor is an NMOS transistor.

5. The current detection start-up circuit of claim 1, wherein said first and second transistors are connected to an input of said inverter, and said current detection circuit further includes a capacitor connected to said input of said inverter.

6. The current detection start-up circuit of claim 1, wherein said current detection circuit further includes a third transistor, having a diode-like configuration, connected between said first and second transistors.

7. The current detection start-up circuit of claim 1, wherein said reference voltage circuit includes a current mirror and said current detected by said current detection circuit is a current through said current mirror.

8. The current detection start-up circuit of claim 1, wherein said reference voltage circuit includes a first current mirror and said current detection circuit includes a pair of complimentary switches, a first one of said complimentary switches also operating as a second current mirror of said first current mirror in said reference voltage circuit.

9. The current detection start-up circuit of claim 8, wherein a second one of said complimentary switches is controlled by a same voltage that controls said first and second current mirrors.

* * * * *